(12) United States Patent
Bayan et al.

(10) Patent No.: US 7,102,209 B1
(45) Date of Patent: Sep. 5, 2006

(54) SUBSTRATE FOR USE IN SEMICONDUCTOR MANUFACTURING AND METHOD OF MAKING SAME

(75) Inventors: Jaime Bayan, Palo Alto, CA (US); Ashok S. Prabhu, San Jose, CA (US); Fred Drummond, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/650,325

(22) Filed: Aug. 27, 2003

(51) Int. Cl.
*H01L 23/495* (2006.01)

(52) U.S. Cl. .................. 257/666; 257/678; 257/676; 257/669; 257/670; 257/672; 257/687; 257/701

(58) Field of Classification Search .............. 257/666, 257/678, 676, 669, 670, 672, 687, 701
See application file for complete search history.

(56) References Cited

U.S. PATENT DOCUMENTS 6,384,472 B1 * 5/2002 Huang ................ 257/680
6,713,322 B1 * 3/2004 Lee ................ 438/123
6,812,125 B1   11/2004 Mostafazadeh
6,849,944 B1 *  2/2005 Murtuza et al. ............ 257/734
2003/0006055 A1 * 1/2003 Chien-Hung et al. ...... 174/52.1

* cited by examiner

*Primary Examiner*—Eddie C. Lee
*Assistant Examiner*—Junghwa Im
(74) *Attorney, Agent, or Firm*—Beyer Weaver & Thomas LLP

(57) ABSTRACT

A lead-frame based substrate panel for use in semiconductor packaging is described. The substrate panel includes a lead-frame panel having at least one array of device areas. Each device area has a plurality of contacts. The lead-frame panel is filled with a dielectric material to form a relatively rigid substrate panel that can be used for packaging integrated circuits. The top surface of the dielectric material is typically substantially coplanar with the top surface of the lead-frame panel, and the bottom surface of the dielectric material is typically substantially coplanar with the bottom surface of the lead-frame panel.

28 Claims, 6 Drawing Sheets

SUBSTRATE FOR USE IN SEMICONDUCTOR MANUFACTURING AND METHOD OF MAKING SAME

BRIEF DESCRIPTION OF THE INVENTION

This invention relates to the packaging of integrated circuits (ICs). More specifically, this invention relates to substrates for use in IC packaging.

BACKGROUND OF THE INVENTION

The drive toward miniaturization presents many challenges for the IC packaging industry. These challenges are partly addressed through use of leadless lead-frame packages (LLPs), which reduce the footprint and height of IC packages by eliminating leads that protrude from the sides of a package, instead employing contacts that are electrically exposed yet lie flush with an outer surface of the package. An LLP is a surface mounted IC package that uses a metal, usually copper, lead-frame substrate to both support the IC die and provide electrical connectivity. As illustrated in FIG. 1A and the successively more detailed FIGS. 1B and 1C, in known LLPs, a copper lead-frame strip or panel 101 is patterned, usually by stamping or etching, to define two dimensional arrays 103 of device areas 105. Each device area 105 is configured to support a semiconductor die. In the illustrated embodiment, each device area 105 includes a die attach pad 107 and a plurality of contacts 109 disposed about their associated die attach pad 107. Very fine tie bars 111 are used to support die attach pads 107 and contacts 109 during manufacturing. Although the thickness of the metal sheets from which the LLP lead-frames are made may vary, a typical thickness may be on the order of 8 mils (0.008") thick.

During assembly, IC dice are attached to respective die attach pads 107 and conventional wire bonding is used to electrically couple bond pads on each die to associated contacts 109 on the device area 105. After wire bonding, a plastic cap is molded over the top surface of each device area individually, or over each array 103. The capped dice are then cut from the array and tested using known sawing and testing techniques.

FIG. 2 illustrates a cross-section of a known LLP. The die attach pad 107 supports semiconductor die 120, usually attached by an adhesive 160. Die 120 is electrically connected to its associated contacts 109 by bonding wires 122. A molded plastic cap 125 encapsulates the die 120 and bonding wires 122 and fills the gaps between the die attach pad 107 and the contacts 109, thereby holding the contacts in place. During singulation, tie bars 111 are cut. The resulting packaged chip can then be surface mounted on a printed circuit board or other substrate using known techniques.

Although the current lead-frame based chip scale package designs work well, there are continuing efforts to provide new and better packages for specific applications.

SUMMARY OF THE INVENTION

A lead-frame based substrate panel for use in semiconductor packaging is described. The substrate panel includes a lead-frame panel having at least one array of device areas and preferably at least one two-dimensional array of device areas. Each device area has a plurality of contacts. The lead-frame panel is filled with a dielectric material to form a relatively rigid substrate panel that can be used for packaging integrated circuits. The top surface of the dielectric material is typically substantially coplanar with the top surface of the lead-frame panel, and the bottom surface of the dielectric material is typically substantially coplanar with the bottom surface of the lead-frame panel.

In some embodiments, each device area has a plurality of contacts exposed on a bottom surface of the substrate panel, a plurality of wire bonding landings exposed on a top surface of the substrate panel, and lead segments electrically coupling selected wire bonding landings to their associated contacts. In this arrangement, the wire bonding landings and the lead segments are preferably thinner than the substrate panel, so that the wire bonding landings are not exposed on the bottom surface of the substrate panel. Although the wire bonding landings are not the full thickness of the substrate panel, the described arrangement still provides a firm base for wire bonding since there is dielectric material below the wire bonding landings. This arrangement is particularly well suited for forming grid array style packages.

The lead-frame panel may include a matrix of tie bars positioned between adjacent device areas and configured to support the lead segments. It may also include die attach pads that are exposed on the top surface of the substrate panel. In some embodiments, each die attach pad may have a plurality of posts exposed on the bottom surface of the substrate panel.

The described substrate panel may be used to efficiently package a number of integrated circuits. A die is mounted on the substrate in each of the device areas and connectors (e.g. bonding wires) are used to electrically connect each die to their associated contacts. An encapsulant is then used to encapsulate the die and connectors. The device areas may be encapsulated either individually or as a group in an array. The encapsulant and the dielectric material used in the substrate may optionally be formed of the same or a similar material.

Methods of forming the substrate panel and packaging integrated circuits using the substrate panel are also described.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

In one embodiment of the present invention, an improved substrate is described in which portions of the device areas are filled in with a dielectric material. This dielectric material supports the wire bonding landings during wirebonding, eliminating the need for exposed electrically conductive areas that must be covered with insulating strips. It also fills in gaps around the die attach pad, preventing adhesive from flowing into the gaps and eliminating the need to use costly B-stage adhesive.

This embodiment of the invention is well suited for use in leadless leadframe packages (LLPs), although one of skill will realize that it can be applied to other types of IC packages as well. Thus, the invention should not be construed as being limited to the LLP context. Instead, the invention can be applied to improve any lead-frame in which Support during wirebonding and/or the mitigation of excess die attach adhesive is desirable.

Figure 1A:
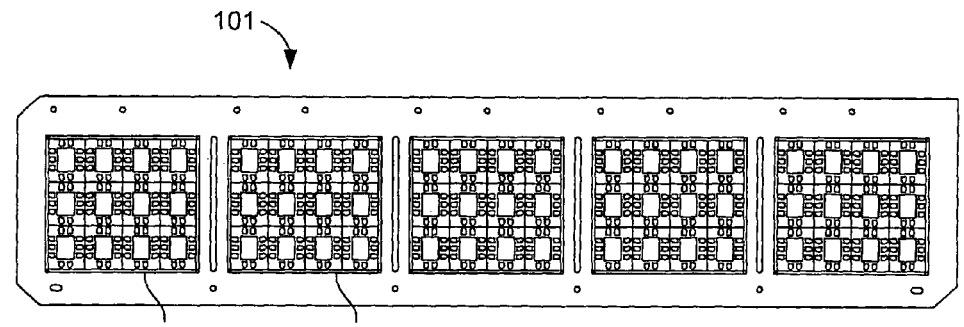
FIG. 1A illustrates a diagrammatic top view of a lead-frame strip suitable for use in packaging integrated circuits.
Figure 1B:
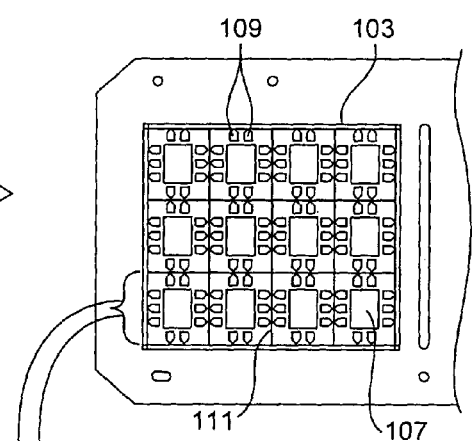
FIGS. 1B–1C illustrate successively more detailed views of selected elements of the lead-frame strip of FIG. 1A.
Figure 1C:
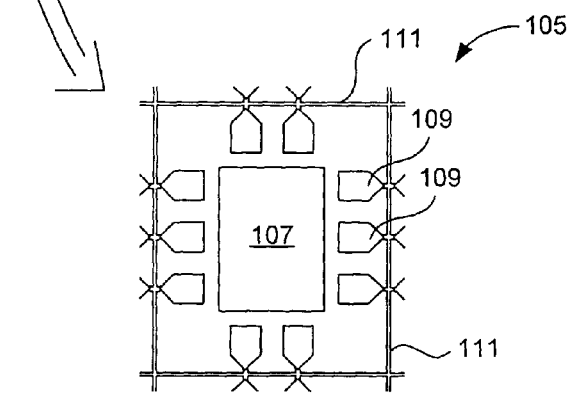
Figure 2:
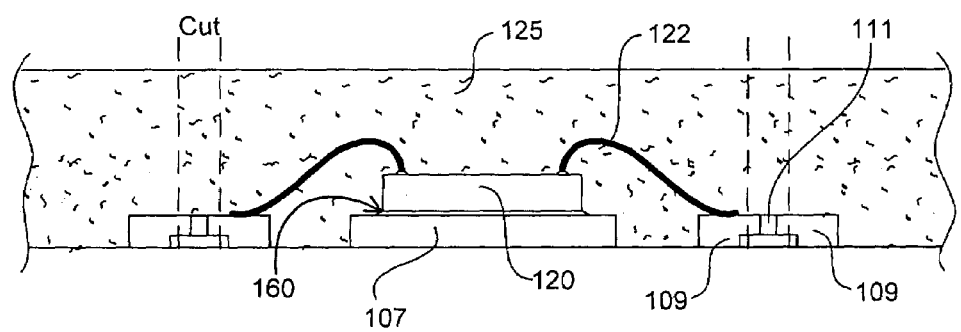
FIG. 2 illustrates a diagrammatic cross-sectional view of an IC package constructed in accordance with the prior art.
Figure 3A:
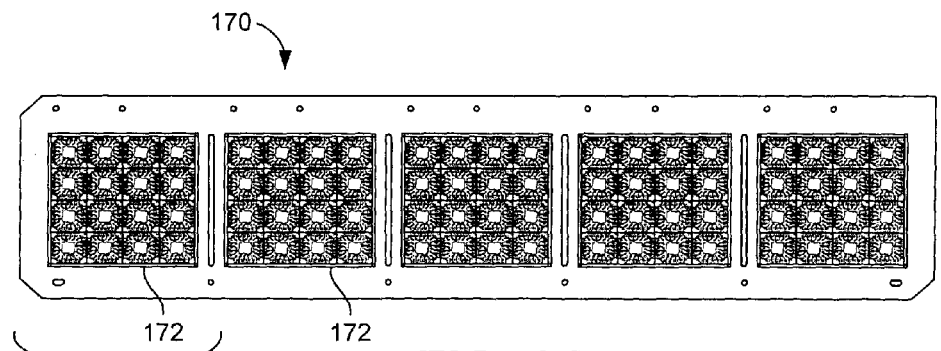
FIG. 3A illustrates a diagrammatic top view of a lead-frame strip suitable for use in packaging integrated circuits.
Figure 3B:
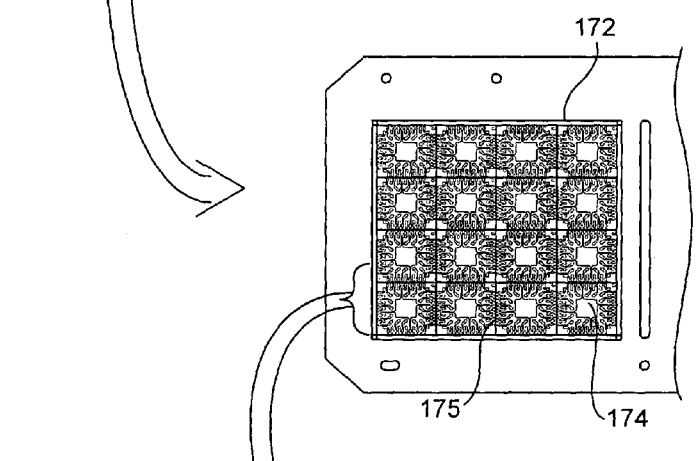
FIGS. 3B–3C illustrate successively more detailed views of selected elements of the lead-frame strip of FIG. 3A.
Figure 3C:
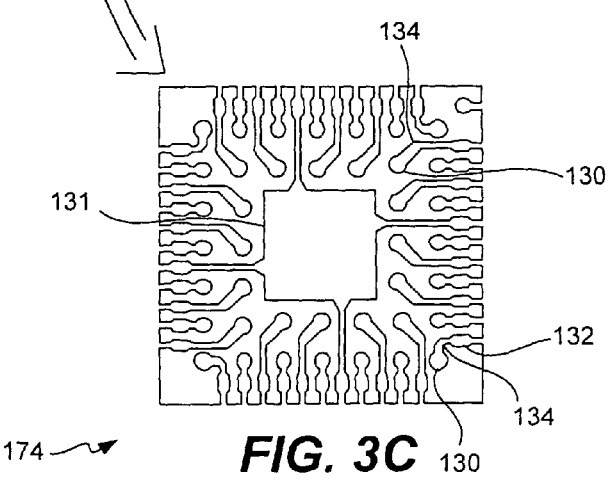

In co-pending application Ser. No. 09/990,083 filed on Nov. 20, 2001, Bayan et al. disclosed a leadless lead-frame strip design suitable for forming grid array style packages. FIG. 3A illustrates a diagrammatic top view of such a lead-frame strip. The lead-frame strip 170 shown is similar in concept to that shown in FIG. 1A in that it also contains two dimensional arrays 172 of device areas 174 that are connected to each other using a matrix of fine tie bars 175. The arrays 172 of the lead-frame strip 170 can be organized in any two dimensional manner that facilitates the handling, die attach, encapsulation, and/or cutting processes. Each device areas 174 is capable of supporting a semiconductor die. FIGS. 3B–3C illustrate successively more detailed views of the lead-frame strip 170 and in particular the arrays 172. Similar to the device area 105 of FIG. 1, the device area 174 may include a die attach pad 131 suitable for receiving a die 120. However, in place of the peripheral contacts 109, the device areas 174 include lead contacts 130 electrically connected to the wire bonding landings 132 by lead segments 134. The die attach pad 131 may optionally be electrically connected to certain of the wire bonding landings 132 to allow downbonding, and therefore electrical grounding, of the die 120.

Figure 4A:
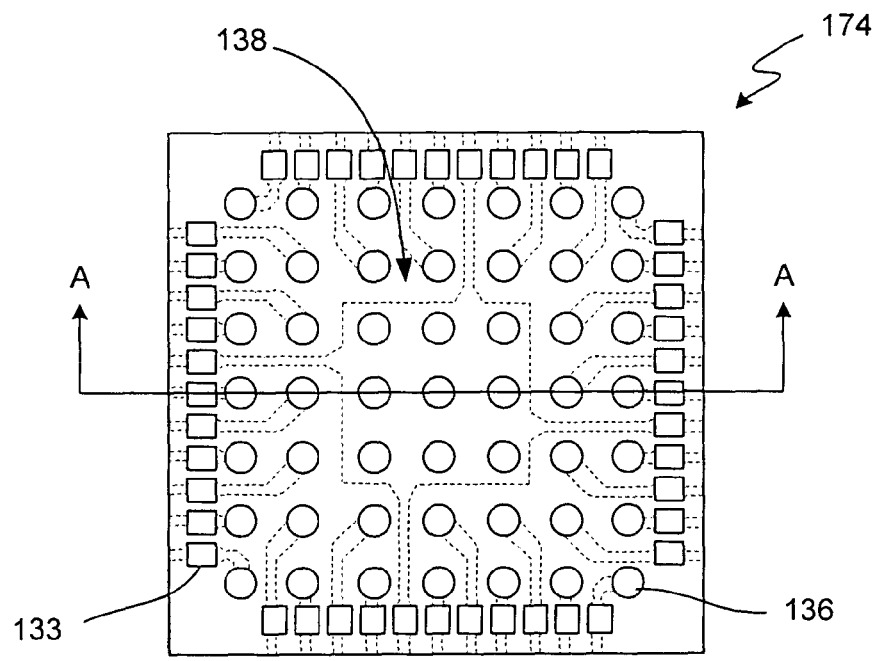
FIG. 4A illustrates a diagrammatic bottom view of selected elements of the lead-frame strip of FIG. 3A.

FIG. 4A illustrates a diagrammatic bottom view of a single device area 174 after encapsulation. As seen therein, the wire bonding landings 132 are exposed on the bottom surface of the package, producing exposed posts 133. Similarly, the die attach pad and other components such as lead contacts 130 are supported by contact pads 136. The contact pads 136 can support the die attach pad 131 during die attachment and wire bonding. As the contact pads 136 are also electrically exposed on the bottom surface of the packaged chip, they can also act to ground and/or electrically couple the die 120 if bond wires 122 are downbonded to the die attach pad 131.

Features such as the contact pads 136 and posts 133 are created by masking appropriate areas and half-etching material from the bottom surface of the device area 174 using known masking and etching techniques. The etching process produces a half-etched area 138, with substrate material that has been removed to leave masked areas such as the posts 133 and contact pads 136 raised relative to the remainder of the device area 174. When the device area 174 is encapsulated to produce an IC package, the contact pads 136 and posts 133 are left electrically exposed. In this manner, solder balls can be placed on the contact pads 136 so that the resulting LLP package simulates a ball grid array (BGA) type package, in which electrical connection to the die 120 is made through a two dimensional array of contact pads 136.

Those of skill in the art will realize that the posts 133 and contact pads 136 can be distributed to form many different two-dimensional arrays. In particular, the contact pads 136 can be arranged in any manner along the bottom surface of the IC package, with lead segments 134 used to connect the contact pads 136 to the wire bonding landings 132.

Figure 4B:
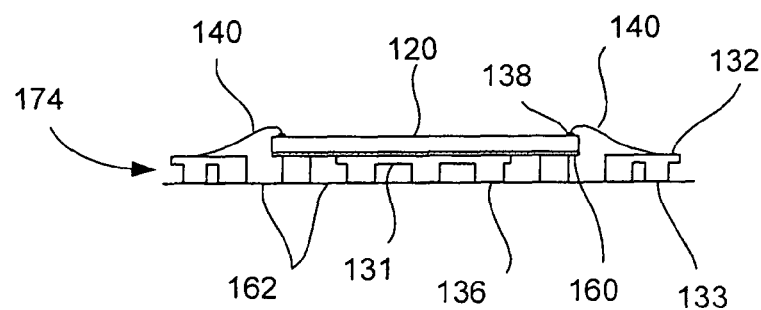
FIG. 4B illustrates a diagrammatic cross-sectional view of selected elements of the lead-frame strip of FIG. 4A subsequent to die attach and wirebonding processes.

FIG. 4B illustrates a cross-section view of the device area 174. FIG. 4B, which illustrates section A—A of FIG. 4A, shows the device area 174 after the die attach process. Die 120 is attached to the die attach pad 131 with an adhesive 160. Bond wires 140 are then attached between bond pads 138 on the die 120, and wire bonding landings 132.

When dies 120 exceed the size of the die attach pad 131, as is increasingly the case, there is a risk of the adhesive 160 overflowing the die attach pad 131 and entering spaces 162 between features on the device area 174. Such overflowing can interfere with the molding process in a number of ways. For example, the presence of adhesive 160 within spaces 162 can result in air bubbles or other voids in the encapsulating material, which can compromise the reliability of the package or create a cosmetically deficient product. Such overflow issues often necessitate the use of more expensive B-stage adhesive, which does not pose a risk of flowing into spaces 162, rather than less expensive epoxy adhesives.

Additionally, as the wire bonding landings 132 must be supported during wirebonding, posts 133 are fabricated that extend to the bottom surface of the device area 174. The posts 133 would then remain exposed even after application of the molded plastic cap 125. Because these contacts remain in electrical communication with the die 120 after packaging, they must be covered with an insulating strip or somehow electrically insulated using an additional process that adds time and expense to the packaging process.

Figure 5A:
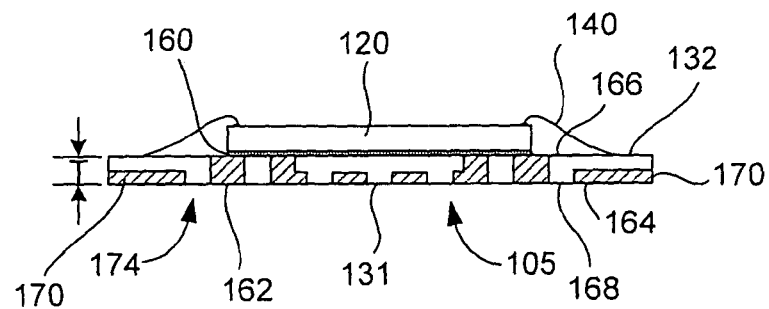
FIG. 5A illustrates a diagrammatic bottom view of a device area in a lead-frame constructed in accordance with an embodiment of the invention.

FIG. 5A illustrates a cross-sectional view of the device area of a lead-frame substrate constructed in accordance with an embodiment of the invention. The device area of FIG. 5A is similar in certain respects to that shown in FIGS. 4A–4B, but contains modifications specifically designed to remedy the above-described problems of adhesive overflow and support for the wire bonding landings 132. The substrate is shown after die attach and wirebonding have taken place, but before encapsulation. Prior to attaching the die 120, a dielectric material 164 is used to fill spaces 162, thus preventing adhesive 160 from flowing into the spaces 162. As there is no longer a risk of excess adhesive flowing into the spaces 162, cheaper epoxy adhesives can be employed, instead of more expensive B-stage adhesive. Similarly, areas 170 under the wire bonding landings 132 are half-etched instead of masked. The area 170 is then filled with dielectric material 164 which, when it hardens, serves to support the wire bonding landing 132 during wirebonding. The presence of the hardened dielectric material 164 eliminates the need for exposed posts 133, thus saving the process time and expense required to fabricate posts 133 and cover them with insulating strips.

Figure 5B:
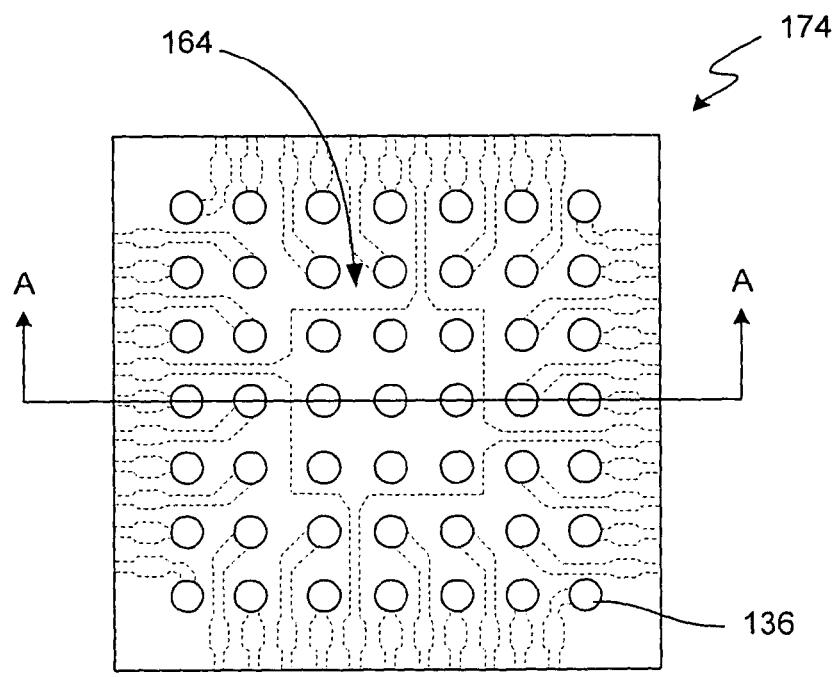
FIG. 5B illustrates a diagrammatic bottom view of selected elements of a lead-frame strip constructed in accordance with an embodiment of the invention.

FIG. 5B illustrates a bottom view of the device area 174 of FIG. 5A. The posts 133 have been half-etched away, and the corresponding space has been filled with dielectric material 164. Once the encapsulation process is complete, the only electrically exposed conductive areas that can be seen are the contact pads 136. In this manner, the invention thus eliminates the need for application of any extra electrically insulative material.

While the posts 133 have been removed in the device area 174 of FIGS. 5A–5B, it should be noted that such removal need not always occur. If posts 133 can be covered with minimal effort and expense, or if unwanted electrical connections to the posts 133 will not detract from the functioning of the IC 120, the device area 174 can retain the posts 133. In such a configuration the dielectric material 164 will continue to fill spaces 162, allowing the use of epoxy rather than B-stage adhesive. Conversely, the invention includes the use of B-stage adhesive as the adhesive 160 for any reason, even when the dielectric material 164 exists to fill spaces 162.

It is beneficial to apply the dielectric material 164 in such a way that, when the die 120 is to be attached, the top surface of the dielectric material is flush, or substantially coplanar, with the top surface 166 of the device area 174. In other words, dielectric material 164 fills in spaces 162 throughout the entire thickness T of the device area 174. This minimizes the existence of any gaps or depressions where excess adhesive 160 can collect. It is also beneficial to apply the dielectric material 164 so that its bottom surface is flush, or substantially coplanar, with the bottom surface 168 of the device area 174. This provides optimum support to the wire bonding landings 132 during wirebonding, and also eliminates the need for expensive adhesive tape during the encapsulation of packages such as LLPs, quad flat no-lead (QFN) packages, and leadless plastic chip carriers (LPCCs).

Figure 6:
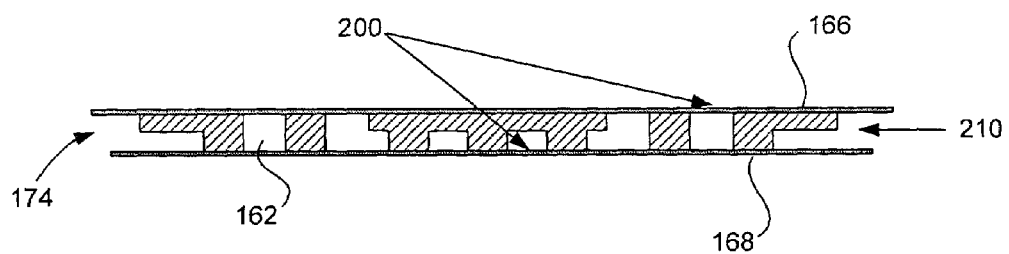
FIG. 6 illustrates process details for a device area in a lead-frame strip to be modified in accordance with an embodiment of the invention.

The invention includes the use of any known method to insert dielectric material 164 into spaces 162 within device areas 174. However, it is helpful to describe some of these methods. FIG. 6 illustrates details of one such method for modifying a substrate in accordance with an embodiment of the invention. Here, a laminate 200 is applied to the upper and lower surfaces of a lead-frame strip 170. For ease of illustration, only one device area 174 is shown.

A liquid form of the dielectric material 164 is then injected into the substrate panel 101 (for example, in the direction of arrow 210), where it flows into spaces 162 within the device areas 174. The laminate 200 serves to prevent dielectric material from flowing out of the device area 174 when it is applied. Once the dielectric material 164 is allowed to set, or harden, the laminates 200 can be removed. The upper and lower surfaces 166, 168 are then deflashed to remove any excess dielectric material, and cleaned.

One of skill will recognize that the invention includes other aspects besides those discussed or illustrated. For example, while it is often more efficient to laminate entire substrate panels 101, and thus many device areas 174, it is also possible to individually laminate substrates 174 and inject them with dielectric material 164. In addition, it is known that the injection of material into confined spaces such as a substrate panel 101 requires the inclusion of gates and channels in the panels 101 to direct the dielectric material 164 appropriately. The invention thus includes the injection of dielectric material 164, and the design of substrate panels 101, according to known molding techniques.

Figure 7:
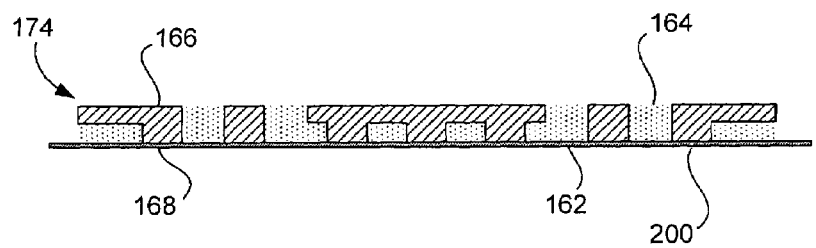
FIG. 7 illustrates process details for a device area in a lead-frame strip to be modified in accordance with an embodiment of the invention.

It should also be noted that the invention is not limited to the fabrication of substrates 174 by injecting dielectric material 164 into spaces 162. Rather, the invention encompasses the use of any known technique for deposition of dielectric material into spaces such as spaces 162. FIG. 7 illustrates one such technique. Here, a laminate 200 is applied to the bottom surface 168 of the substrate 174, and powdered or granulated dielectric material 164 is deposited in spaces 162. The dielectric material 164 is then heated or otherwise subjected to a process that liquefies it, allowing the material 164 to more readily conform to the spaces 162. The material 164 is allowed to cool and/or harden, and the upper and lower surfaces 166, 168 are then deflashed and cleaned.

Once the substrate 174 is deflashed and cleaned, a first layer of dielectric material 164 exists, which is largely of the same thickness as the substrate 174. This substrate 174 can then be used in conventional packaging processes, i.e., a semiconductor die 120 can be applied to the device area 174 according to conventional methods, and a second layer of dielectric material can then be applied over the die 120 to create a molded plastic cap 125. As noted earlier, the first layer of dielectric material 164 allows for the use of cheaper epoxy instead of more expensive B-stage adhesive, and also eliminates exposed posts 133.

The dielectric material 164 can be any material capable of supporting wire bonding landings 132 during wirebonding, and preventing adhesive 160 from flowing into the spaces 162. However, it is often preferable to use the same material for both the dielectric material 164 and molded cap 125. In other words, the first layer and second layer of dielectric material should often be made of the same material. For example, both layers could be fabricated from a standard molding compound used in forming an IC package, such as Bi-Phenyl Base compound. This minimizes any mechanical stresses that may arise during heating or cooling, should the two layers be made of different materials with different thermal expansion properties.

The foregoing description, for purposes of explanation, uses specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise fomls disclosed. Obviously many modifications and variations are possible in view of the above teachings. For example, while certain embodiments of the invention offer advantages in the formation of LLPs, the invention also includes embodiments that confer benefits to other IC package configurations. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A substrate panel for use in semiconductor packaging, comprising:
   a lead-frame panel, including
   an array of device areas, each device area having a die attach pad encircled by & plurality of conductive features, each conductive feature defined by an innermost contact portion, an outermost landing portion, and a connecting lead segment, wherein the innermost contact portion lies proximal to the die attach pad and extends through the lead-frame panel to expose a bottom surface on the bottom of the lead-frame panel and said conductive feature having the outermost landing portion located near an edge of the device area and further away from the die attach pad than the innermost contact portion, the outermost landing portion including a wirebonding surface and having a connecting lead segment that extends between the innermost contact portion and the outermost landing portion wherein the connecting lead segment is thinner than the innermost contact portion that extends through the lead-frame panel; and a dielectric material that fills spaces between adjacent conductive features and that fills spaces underneath the connecting lead segments, wherein a top surface of the dielectric material is substantially coplanar with the top surface of the lead-frame panel and the wire bonding surfaces, and the bottom surface of the dielectric material is substantially coplanar with the bottom surface of the lead-frame panel and said exposed bottom surface of said innermost contact portions, thereby forming lead-frame panel having substantially planar top and bottom surfaces.

2. A substrate panel as recited in claim 1 wherein the outermost landing portions have a portion that is thinner than the lead-frame panel, such that the outermost landing portions are not exposed on the bottom surface of the lead-frame panel and wherein the dielectric material is formed underneath thinner portions of the outermost landing portions to give support to the wirebonding surfaces, said support being sufficient to structurally reinforce the wirebonding surfaces during a wire bond process.

3. A substrate panel as recited in claim 1 wherein the device areas are arranged in at least one two dimensional array such that the lead-frame panel has at least one two-dimensional array of device areas.

4. A substrate panel as recited in claim 3 wherein the lead-frame panel further comprises a matrix of tie bars, the tie bars being positioned between immediately adjacent device areas in the two dimensional array of device areas and configured to support the device areas.

5. A substrate panel as recited in claim 1 wherein the die attach pad has a plurality of posts exposed on the bottom surface of the lead-frame panel.

6. A substrate panel as recited in claim 1 wherein at least one outermost landing portion is directly electrically coupled to the die attach pad by a lead segment.

7. A substrate panel for use in semiconductor packaging, comprising:

a lead-frame panel including a two dimensional array of device areas, each device area having a plurality of conductive features, each conductive feature having, a contact portion having an exposed bottom surface at the bottom of the substrate panel wherein the contacts are arranged in a microarray configuration, a landing portion having a wire bonding surface exposed on a top surface of the substrate panel the landing portion is arranged outward from an associated contact portion and thereby closer to an outer edge of the device area than the associated contact portion, and a connecting lead segment configured to electrically couple each contact portion with its associated landing portion; and a dielectric material that fills spaces between adjacent conductive features and underlies at least a portion of each of the wire bonding surfaces, wherein a top surface of the dielectric material is substantially coplanar with the top surface of the lead-frame panel and the wire bonding surfaces, and wherein a bottom surface of the dielectric material is substantially coplanar with the bottom surface of the lead-frame panel and the exposed bottom surface of the contact portion.

8. A substrate panel as recited in claim 7 wherein each device area further includes a die attach pad, the die attach pad being exposed on the top surface of the lead-frame panel.

9. A substrate panel as recited in claim 8 wherein the contact portions surround the die attach pad, and wherein the die attach pad has a plurality of posts exposed on the bottom surface of the lead-frame panel, the contact portions and the posts being arranged in a two dimensional microarray of rows and columns.

10. A substrate panel as recited in claim 8 wherein a wire bonding landing is directly electrically coupled to the die attach pad by a lead segment.

11. A singulated packaged integrated circuit, comprising:

a substrate having an edge, the substrate including a plurality of contacts configured for electrical contact underneath the substrate with the contacts having exposed contact surfaces on a bottom surface of the substrate, a plurality of wire bonding landings being located outward from the contacts and more closely to the edge of the substrate and at a top surface of the substrate, lead segments that extend between the contacts and their associated wire bonding landings electrically coupling the wire bonding landings to associated contacts, and a first dielectric layer that fills spaces between adjacent lead segments and fills space under the wire bonding landings, wherein a top surface of the dielectric layer is substantially coplanar with the top surface of the substrate and the wire bonding landings, and a bottom surface of the dielectric layer that is substantially coplanar with the bottom surface of the substrate and substantially coplanar with said contact surfaces, thereby forming the substrate having substantially planar top and bottom surfaces;

a die mounted on the substrate, the die having a plurality of bond pads configured for electrical connection, to the wire bonding landings;

a plurality of connectors for electrically connecting the plurality of bond pads to associated wire bonding landings; and a second dielectric layer that encapsulates the die and the plurality of connectors and covers at least a portion of the top surface of the substrate.

12. A packaged integrated circuit as recited in claim 11 wherein the first and second dielectric layers are formed from substantially the same materials but are not integrally formed.

13. A packaged integrated circuit as recited in claim 11 wherein the wire bonding landings are thinner than the thickness of the substrate, such that the wire bonding landings are not exposed on the bottom surface of the substrate.

14. A packaged integrated circuit as recited in claim 11 wherein at least selected portions of the lead segments are thinner than the thickness of the lead-frame, such that the selected portions of the lead segments are not exposed on the bottom surface of the substrate.

15. A packaged integrated circuit as recited in claim 11 wherein the substrate further includes a die attach pad surrounded by the contacts, the die attach pad being exposed on the top surface of the substrate.

16. A packaged integrated circuit as recited in claim 15 wherein the die attach pad has a plurality of posts that are exposed on the bottom surface of the substrate.

17. A packaged integrated circuit as recited in claim 15 wherein at least one of the wire bonding landings is directly electrically coupled to the die attach pad by a lead segment.

18. A packaged integrated circuit as recited in claim 15 wherein at least one of the contacts is located between the wire bonding landings and the die attach pad.

19. A substrate panel as recited in claim 1 wherein at least some of the wire bonding surfaces have a width that is wider than an immediately adjacent portion of their associated lead segments and a thickness that is substantially the same as their associated lead segments.

20. A substrate panel as recited in claim 7 wherein at least some of the wire bonding surfaces have a width that is wider than an immediately adjacent portion of their associated lead segments and a thickness that is substantially the same as their associated lead segments wherein the increased width of said wire bonding surfaces facilitates wire bonding to said landings.

21. A packaged integrated circuit as recited in claim 11 wherein the package is a leadframe based microarray package.

22. A substrate panel as recited in claim 1 wherein the plurality of innermost contact portion is exposed on a bottom surface of the substrate panel are arranged in a microarray configuration.

23. A substrate panel as recited in claim 22 wherein the plurality of innermost contact portion arranged as a microarray are patterned in a ball grid array (BGA) configuration.

24. A substrate panel as recited in claim 5 wherein the plurality of exposed bottom surfaces of the contact portions and the plurality of posts exposed on the bottom surface of the lead-frame panel are arranged in a micro array.

25. A substrate panel as recited in claim 24 wherein the exposed bottom surfaces of the contact portions and the plurality of posts exposed contacts and posts on the bottom surface of the lead-frame panel are arranged in a BGA pattern.

26. A substrate panel as recited in claim 7 wherein at least one of the landing portions includes a support footing that extends downward from the bottom surface of said landing portions, the footing configured to support the landing portion during a wirebonding process and having an exposed bottom surface that is substantially coplanar with the bottom surface of the lead-frame panel.

27. A substrate panel as recited in claim 11 wherein at least one of the wire bonding landings includes a support footing that extends downward from the bottom surface of said wire bonding landings, each footing configured to support the landing during a wirebonding process and configured to have an exposed surface that is substantially coplanar with the bottom surface of the lead-frame panel.

28. A substrate panel as recited in claim 7 wherein at least some of the landing portions are thinner than the lead-frame panel, such that the thinner landing portions are not exposed on the bottom surface of the lead-frame panel, and at least some of the connecting lead segments are thinner than the lead-frame panel such that the thinner lead segments are not exposed on the bottom surface of the lead-frame panel.

* * * * *

UNITED STATES PATENT AND TRADEMARK OFFICE
CERTIFICATE OF CORRECTION

| | | |
|---|---|---|
| PATENT NO. | : 7,102,209 B1 | Page 1 of 1 |
| APPLICATION NO. | : 10/650325 | |
| DATED | : September 5, 2006 | |
| INVENTOR(S) | : Bayan et al. | |

It is certified that error appears in the above-identified patent and that said Letters Patent is hereby corrected as shown below:

Column 6, line 45, change "fomls" to --forms--.

Signed and Sealed this

Twenty-eighth Day of August, 2007

JON W. DUDAS
*Director of the United States Patent and Trademark Office*